(12) United States Patent
Ito

(10) Patent No.: US 11,126,078 B2
(45) Date of Patent: Sep. 21, 2021

(54) PATTERN FORMING METHOD, PRODUCTION METHOD FOR PROCESSED SUBSTRATE, PRODUCTION METHOD FOR OPTICAL COMPONENT, PRODUCTION METHOD FOR CIRCUIT SUBSTRATE, PRODUCTION METHOD FOR ELECTRONIC COMPONENT AND PRODUCTION METHOD FOR IMPRINT MOLD

(71) Applicant: CANON KABUSHIKI KAISHA, Tokyo (JP)

(72) Inventor: Toshiki Ito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 326 days.

(21) Appl. No.: 16/042,421

(22) Filed: Jul. 23, 2018

(65) Prior Publication Data
US 2019/0004421 A1  Jan. 3, 2019

Related U.S. Application Data

(63) Continuation of application No. PCT/JP2017/001875, filed on Jan. 20, 2017.
(Continued)

(51) Int. Cl.
*G03F 7/00* (2006.01)
*G03F 7/027* (2006.01)
(Continued)

(52) U.S. Cl.
CPC ...... *G03F 7/0002* (2013.01); *C08F 122/1006* (2020.02); *C08F 220/30* (2013.01);
(Continued)

(58) Field of Classification Search
CPC ...... G03F 7/0002; G03F 7/0005; G03F 7/027; C09D 4/00; H01L 21/0273; H01L 21/31058
See application file for complete search history.

(56) References Cited

U.S. PATENT DOCUMENTS

2016/0187774 A1  6/2016  Ito et al.
2017/0068159 A1*  3/2017  Khusnatdinov ....... G03F 7/0002

FOREIGN PATENT DOCUMENTS

CN  102565942 A  7/2012
CN  103317713 A  9/2013
(Continued)

OTHER PUBLICATIONS

S. Reddy, R. T. Bonnecaze, "Simulation of fluid flow in the step and flash imprint lithography process", Microelectronic Engineering, 82 (2005) 60-70.

*Primary Examiner* — Michael P Wieczorek
(74) *Attorney, Agent, or Firm* — Canon U.S.A., Inc., IP Division

(57) ABSTRACT

A pattern forming method comprising, a step (1) of coating a layer formed of a curable composition (A1) containing at least a certain polymerizable compound (a1) on a surface of a substrate, a step (2) of dispersedly dropping a droplet of a curable composition (A2) containing at least a polymerizable compound (a2) on the layer of the curable composition (A1) to form lamination, a step (3) of sandwiching between a mold and the substrate a layer in which the curable composition (A1) and the curable composition (A2) are partially mixed, a step (4) of curing a portion of the layer in which the two curable compositions are partially mixed all at once by applying light from the side of the mold, the portion being sandwiched between the mold and the substrate, and a step (5) of separating the mold from the layer formed of the cured curable compositions.

17 Claims, 3 Drawing Sheets

Related U.S. Application Data

(60) Provisional application No. 62/286,570, filed on Jan. 25, 2016, provisional application No. 62/393,218, filed on Sep. 12, 2016.

(51) Int. Cl.
*H01L 21/027* (2006.01)
*H01L 21/3105* (2006.01)
*C08F 220/30* (2006.01)
*C08F 122/10* (2006.01)
*C09D 4/00* (2006.01)
*C08F 222/10* (2006.01)

(52) U.S. Cl.
CPC ............ *C09D 4/00* (2013.01); *G03F 7/0005* (2013.01); *G03F 7/027* (2013.01); *H01L 21/0273* (2013.01); *H01L 21/31058* (2013.01); *C08F 222/102* (2020.02)

(56) References Cited

FOREIGN PATENT DOCUMENTS

| | | | | |
|---|---|---|---|---|
| CN | 103392221 A | 11/2013 | | |
| CN | 104903072 A | 9/2015 | | |
| JP | 2009-083172 A | 4/2009 | | |
| JP | 4791357 B2 | 10/2011 | | |
| JP | 2014-150259 A | 8/2014 | | |
| JP | 2015-179806 A | 10/2015 | | |
| JP | 2015179806 A | 10/2015 | | |
| WO | 2015/041154 A1 | 3/2015 | | |
| WO | WO-2015041154 A1 * | 3/2015 | ............ | G03F 7/029 |
| WO | 2015/170465 A | 11/2015 | | |

* cited by examiner

PRIOR ART

FIG. 2A1  201
FIG. 2A2  202
FIG. 2B1  203
FIG. 2B2 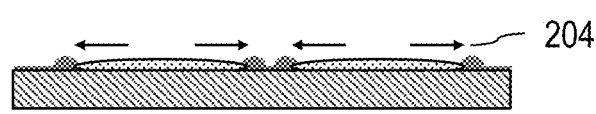 204
  205
  206
  207

PATTERN FORMING METHOD, PRODUCTION METHOD FOR PROCESSED SUBSTRATE, PRODUCTION METHOD FOR OPTICAL COMPONENT, PRODUCTION METHOD FOR CIRCUIT SUBSTRATE, PRODUCTION METHOD FOR ELECTRONIC COMPONENT AND PRODUCTION METHOD FOR IMPRINT MOLD

CROSS-REFERENCE TO RELATED APPLICATIONS

This application is a Continuation of International Patent Application No. PCT/JP2017/001875, filed Jan. 20, 2017, which claims the benefit of U.S. Provisional Patent Application Nos. 62/286,570, filed Jan. 25, 2016, and 62/393,218, filed Sep. 12, 2016, all of which are hereby incorporated by reference herein in their entirety.

BACKGROUND OF THE INVENTION

Field of the Invention

The present invention relates to a pattern forming method, a production method for a processed substrate, a production method for an optical component, a production method for a circuit substrate, a production method for an electronic component and a production method for an imprint mold.

Description of the Related Art

There is a strong demand for microfabrication in semiconductor devices, MEMSs and the like, and an attention is paid to an optical nanoimprint lithography as a microfabrication technology.

In the optical nanoimprint lithography, a photocurable composition is cured under the condition where a mold on the surface of which a fine uneven pattern is formed is pressed against a substrate (wafer) to which the photocurable composition (resist) is applied, whereby the uneven pattern on the mold is transferred to a cured film of the photocurable composition to form a pattern on the substrate. According to the optical nanoimprint lithography, a fine structure in the order of nanometers can be formed.

An optical nanoimprint lithography described in Japanese Patent No. 4791357 is described with reference to FIGS. 1A1 to 1D. First, a liquid resist is dispersedly dropped on a pattern forming region of a substrate by means of an ink jet method (arranging step, FIGS. 1A1 to 1A3). A droplet of the resist dropped spreads on the substrate, and this phenomenon is called prespread (FIGS. 1A1 to 1A3, 104). This resist is then molded by means of a mold (pattern) on which a pattern has been formed and which is transparent to irradiation light which will be described later (mold contact step, FIG. 1B). In the mold contact step, the droplet of the resist spreads over the whole region of a space between the substrate and the mold owing to a capillary phenomenon (FIG. 1B, 104). This phenomenon is called spread. In addition, in the mold contact step, the resist is filled even into the interior of a depressed portion on the mold by the capillary phenomenon (FIG. 1B, 104). This filling phenomenon is called fill. A time until the spread and fill are completed is called filling time. After the filling of the resist is completed, the resist is cured by irradiating it with light (light irradiation step, FIG. 1C) and then separated (mold releasing step, FIG. 1D). These steps are carried out, whereby a resist pattern (photo-cured film, FIG. 1D, 107) having a predetermined form is formed on the substrate.

In the optical nanoimprint lithography described in Japanese Patent No. 4791357, there has been a problem that a time from the beginning of the mold contact to the completion of the spread and fill (filling time) is long, and the throughput is low.

SUMMARY OF THE INVENTION

A pattern forming method according to the present invention is a pattern forming method having, in the following order, a step (1) of coating a layer formed of a curable composition (A1) containing at least a polymerizable compound (a1) on a surface of a substrate, a step (2) of dispersedly dropping a droplet of a curable composition (A2) containing at least a polymerizable compound (a2) on the layer of the curable composition (A1) to form lamination, a step (3) of sandwiching between a mold and the substrate a layer in which the curable composition (A1) and the curable composition (A2) are partially mixed, a step (4) of curing a portion of the layer in which the two curable compositions are partially mixed all at once by applying light from the side of the mold, the portion being sandwiched between the mold and the substrate, and a step (5) of separating the mold from the layer formed of the cured curable compositions, wherein the curable composition (A1) contains at least a compound represented by the following general formula (1) as the polymerizable compound (a1):

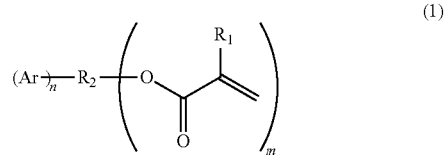

In the general formula (1), Ar denotes a monovalent aromatic group which may have a substituent, $R_1$ denotes an alkyl group which may have a substituent or a hydrogen atom, $R_2$ denotes an (m+n)-valent alkyl group which may have a substituent, m is an integer of 2 or more, and n is an integer of 1 or more.

Further features of the present invention will become apparent from the following description of exemplary embodiments with reference to the attached drawings.

BRIEF DESCRIPTION OF THE DRAWINGS

FIG. 1A1 illustrates schematic sectional views illustrating a prior art example of the optical nanoimprint lithography.

FIG. 1A2 illustrates schematic sectional views illustrating a prior art example of the optical nanoimprint lithography.

FIG. 1A3 illustrates schematic sectional views illustrating a prior art example of the optical nanoimprint lithography.

FIG. 2A1 illustrates schematic sectional views illustrating an optical nanoimprint lithography according to this embodiment of the present invention.

FIG. 2A2 illustrates schematic sectional views illustrating an optical nanoimprint lithography according to this embodiment of the present invention.

FIG. 2B1 illustrates schematic sectional views illustrating an optical nanoimprint lithography according to this embodiment of the present invention.

FIG. 2B2 illustrates schematic sectional views illustrating an optical nanoimprint lithography according to this embodiment of the present invention.

DESCRIPTION OF THE EMBODIMENTS

Figure 1B:
FIG. 1B illustrates schematic sectional views illustrating a prior art example of the optical nanoimprint lithography.
Figure 1B:
Figure 1B:
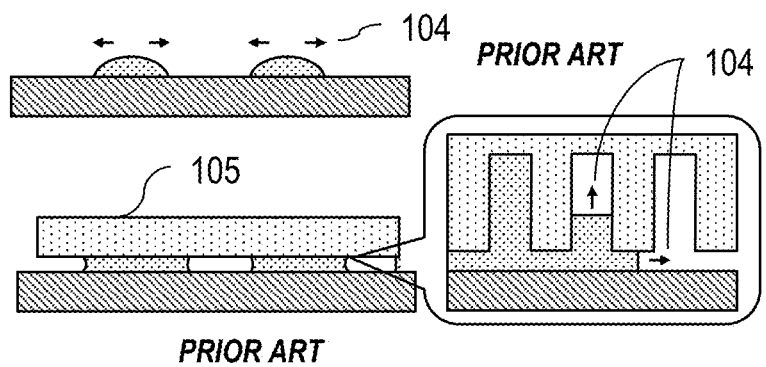
Figure 1C:
FIG. 1C illustrates schematic sectional views illustrating a prior art example of the optical nanoimprint lithography.
Figure 1D:
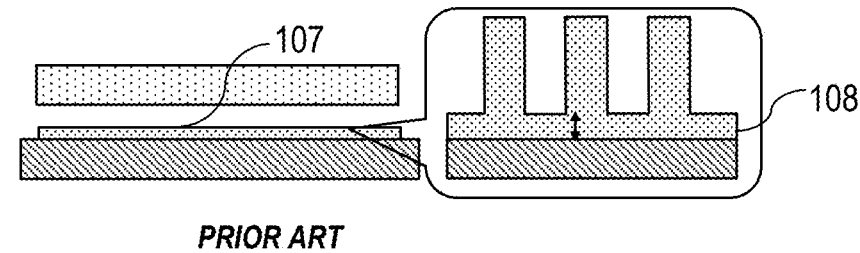
FIG. 1D illustrates schematic sectional views illustrating a prior art example of the optical nanoimprint lithography.

The pattern forming method according to the present invention is a pattern forming method comprising, in the following order,
a step (1) of coating a layer formed of a curable composition (A1) containing at least a polymerizable compound (a1) on a surface of a substrate,
a step (2) of dispersedly dropping a droplet of a curable composition (A2) containing at least a polymerizable compound (a2) on the layer of the curable composition (A1) to form lamination,
a step (3) of sandwiching between a mold and the substrate a layer in which the curable composition (A1) and the curable composition (A2) are partially mixed,
a step (4) of curing a portion of the layer in which the two curable compositions are partially mixed all at once by applying light from the side of the mold, the portion being sandwiched between the mold and the substrate, and
a step (5) of separating the mold from the layer formed of the cured curable compositions
wherein the curable composition (A1) contains at least a compound represented by the following general formula (1) as the polymerizable compound (a1):

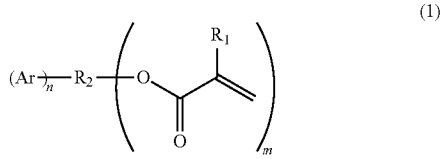

(1)

In the general formula (1), Ar denotes a monovalent aromatic group which may have a substituent, $R_1$ denotes an alkyl group which may have a substituent or a hydrogen atom, $R_2$ denotes an (m+n)-valent alkyl group which may have a substituent, m is an integer of 2 or more, and n is an integer of 1 or more.

The curable composition (A1) favorably contains at least a compound represented by the following general formula (2) as the polymerizable compound (a1).

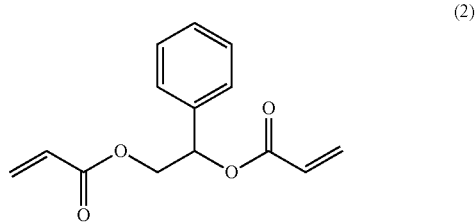

(2)

In addition, the curable composition (A1) favorably contains at least a compound represented by the following general formula (3) as the polymerizable compound (a1).

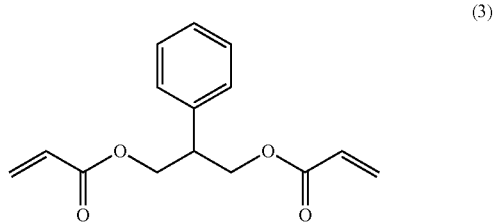

(3)

In addition, the pattern forming method according to the present invention is a pattern forming method comprising, in the following order:
a step (1) of coating a layer formed of a curable composition (A1) containing at least a polymerizable compound (a1) on a surface of a substrate,
a step (2) of dispersedly dropping a droplet of a curable composition (A2) containing at least a polymerizable compound (a2) on the layer of the curable composition (A1) to form lamination,
a step (3) of sandwiching between a mold and the substrate a layer in which the curable composition (A1) and the curable composition (A2) are partially mixed,
a step (4) of curing a portion of the layer in which the two curable compositions are partially mixed all at once by applying light from the side of the mold, the portion being sandwiched between the mold and the substrate, and/a
step (5) of separating the mold from the layer formed of the cured curable compositions,
wherein the curable composition (A1) contains at least a compound represented by the following general formula (6) as the polymerizable compound (a1):

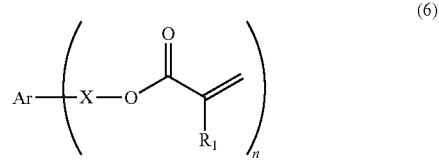

(6)

In the general formula (6), Ar denotes a monovalent, divalent, trivalent or tetravalent aromatic group which may have a substituent, X represents a single bond or an organic linking group, R1 denotes an alkyl group which may have a substituent or a hydrogen atom, n is an integer of 1, 2, 3 or 4.

The curable composition (A1) favorably contains at least a compound represented by the following general formula (7) as the polymerizable compound (a1).

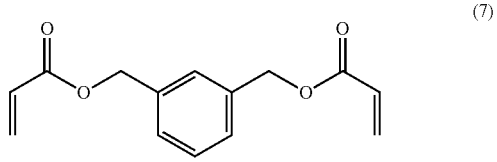
(7)

In addition, the curable composition (A1) favorably contains at least a compound represented by the following general formula (8) as the polymerizable compound (a1).

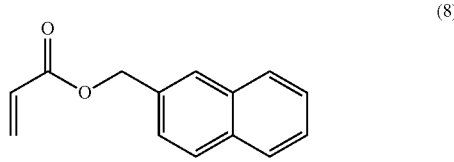
(8)

In addition, the curable composition (A1) favorably contains at least a compound represented by the following general formula (9) as the polymerizable compound (a1).

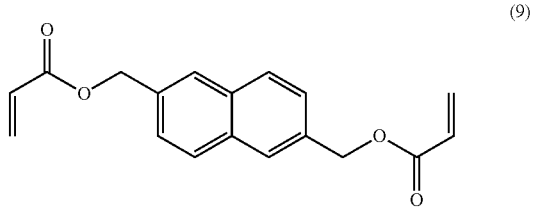
(9)

In addition, the curable composition (A1) favorably contains at least a compound represented by the following general formula (10) as the polymerizable compound (a1).

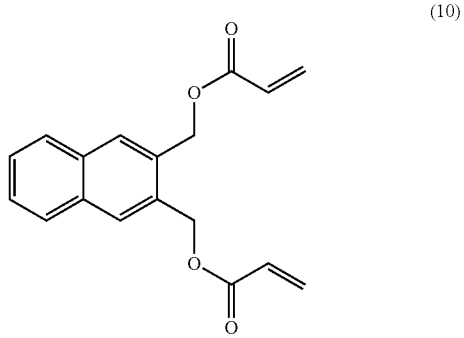
(10)

In addition, the surface tension of the curable composition (A1) except solvents is favorably higher than the surface tension of the curable composition (A2) except solvents.

In addition, it is favorable that the viscosity of the curable composition (A1) except the solvents is 1 mPa·s or more to 1000 mPa·s or less, and the viscosity of the curable composition (A2) except the solvents is 1 mPa·s or more to 12 mPa·s or less.

In addition, the material of the surface of the mold is favorably quartz.

In addition, the mold contact step is favorably conducted under an atmosphere containing a condensable gas.

In addition, the second step is favorably conducted under an atmosphere of a mixed gas of a condensable gas and a non-condensable gas.

In addition, the non-condensable gas is favorably helium.

In addition, the condensable gas is favorably 1,1,1,3,3-pentafluoropropane.

In addition, a production method for a processed substrate including the above-described pattern forming method is included.

In addition, a production method for an optical component including the above-described pattern forming method is included.

In addition, a production method for an imprint mold including the above-described pattern forming method is included.

Embodiments of the present invention will hereinafter be suitably described in detail with reference to the drawings. However, the present invention is not limited to the embodiments described below. In addition, in the present invention, those obtained by suitably changing or modifying the embodiments described below within such a range as not to go beyond the gist thereof on the basis of the ordinary knowledge of those skilled in the art are also included in the scope of the present invention.

The present invention relates to an optical nanoimprint lithography with short filling time, in other words, high throughput (Short Spread Time Nanoimprint Lithography; hereinafter referred to as SST-NIL).

SST-NIL is described with reference to the schematic sectional views illustrated in FIGS. 2A1 to 2E.

SST-NIL has a coating step 1 (FIGS. 2A1, 2A2) of coating a liquid curable composition (A1) on a substrate, a coating step 2 (FIGS. 2B1, 2B2) of dispersedly dropping a droplet of a curable composition (A2) on the layer of the curable composition (A1), a mold contact step (FIG. 2C) of sandwiching between a mold and the substrate a layer in which the curable composition (A1) and the curable composition (A2) are partially mixed, a light irradiation step (FIG. 2D) of curing the layer in which the two curable compositions are partially mixed all at once by applying light from the side of the mold, and a mold releasing step (FIG. 2E) of separating the mold from the layer formed of the cured curable compositions.

In SST-NIL, a series of step units from the coating step 1 (FIGS. 2B1, 2B2) to the mold releasing step (FIG. 2E) is called "shot", and a region in which the mold comes into contact with the curable compositions (A1) and (A2), that is, a region in which a pattern is formed on the substrate is called "shot region".

In SST-NIL, the droplet of the curable composition (A2) which has been dispersedly dropped promptly spreads on a liquid film of the curable composition (A1), so that the filling time is short, and the throughput is high.

A detailed mechanism of SST-NIL will hereinafter be described.

The feature of SST-NIL is described with reference to the schematic sectional views illustrated in FIGS. 2A1 to 2E.

The droplet of the curable composition (A2) 203 dropped on the liquid film of the curable composition (A1) 202 spreads while mixing with the curable composition (A1) 202, followed by stamping by the mold 205.

Here, a region in which the concentration of the curable composition (A1) is high is created between droplets of the curable composition (A2) 203. To the contrary, the concentration of the curable composition (A2) is high at a central portion of each of the droplets of the curable composition (A2).

The substrate 201 may be processed by dry etching in some cases by using a cured film 207 having a pattern form, that is, a mixed cured product of the curable composition (A1) and the curable composition (A2), as a mask for dry etching.

In this case, there is a risk that non-uniformity of dry etching resistance may be caused in the cured film 207 on the basis of the above-described concentration non-uniformity. For this reason, the curable composition (A1) is required to have dry etching resistance equal to or more than that of the curable composition (A2).

In addition, the curable composition (A1) is not only necessary to have good dry etching resistance, but also necessary to be of low viscosity to some extent for attaining the high throughput effect of SST-NIL.

Thus, the present invention provides an SST-NIL technique which enables high throughput and excellent uniformity of dry etching processing.

[Curable Composition]

The curable compositions (A1) and (A2) according to this embodiment are compounds having at least a component (a) which is a polymerizable compound. The curable compositions according to this embodiment may additionally contain a component (b) which is a photopolymerization initiator, a non-polymerizable compound (c) and a component (d) which is a solvent.

In addition, the cured film in the present specification means a film cured by polymerizing curable compositions on a substrate. Incidentally, no particular limitation is imposed on the form of the cured film, and it may also have a pattern form on its surface.

The respective components will hereinafter be described in detail.

<Component (a): Polymerizable Compound>

The component (a) is a polymerizable compound. Here, the polymerizable compound in the present specification is a compound which reacts with a polymerizing agent (for example, a radical) generated from the photopolymerization initiator (component (b)) to form a film composed of a high-molecular compound by a chain reaction (polymerization reaction).

Examples of such a polymerizable compound include radically polymerizable compounds. The polymerizable compound which is the component (a) may be made up of only one kind of a polymerizable compound, or may also be made up of plural kinds of polymerizable compounds.

The radically polymerizable compound is favorably a compound having one or more acryloyl groups or methacryloyl groups, that is, a (meth)acrylic compound. Accordingly, the curable compositions according to this embodiment favorably contain a (meth)acrylic compound as the component (a), and it is more favorable that the main component of the component (a) is a (meth)acrylic compound, and it is most favorable that it is the (meth)acrylic compound. Incidentally, the above-mentioned feature that the main component of the component (a) is a (meth)acrylic compound means that 90% by weight or more of the component (a) is the (meth)acrylic compound.

When the radically polymerizable compound is made up of plural kinds of compounds having one or more acryloyl groups or methacryloyl groups, it favorably contains a monofunctional (meth)acrylic monomer and a polyfunctional (meth)acrylic monomer. The reason for this is that a cured film having strong mechanical strength is obtained by combining the monofunctional (meth)acrylic monomer and the polyfunctional (meth)acrylic monomer.

The curable composition (A1) according to this embodiment contains, as a polymerizable compound, a polyfunctional (meth)acrylic monomer represented by the following general formula (1) as the polymerizable compound (a) component.

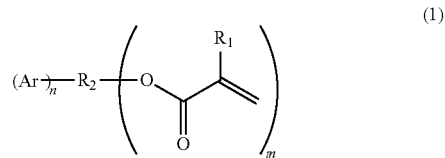

(1)

In the general formula (1), Ar denotes a monovalent aromatic group which may have a substituent, R1 denotes an alkyl group which may have a substituent or a hydrogen atom, R2 denotes an (m+n)-valent alkyl group which may have a substituent, m is an integer of 2 or more, and n is an integer of 1 or more.

Incidentally, m is favorably an integer of 2 or more to 4 or less, and n is favorably an integer of 1 or more to 4 or less.

The cured film of the curable composition (A1) according to this embodiment which contains the polyfunctional (meth)acrylic monomer represented by the general formula (1) as the polymerizable compound has high dry etching resistance.

In addition, the polyfunctional (meth)acrylic monomer represented by the general formula (1), specifically, for example, PhEDA or PhPDA which will be described later has a relatively low viscosity of about 100 mPa·s or less in particular. The spread and fill are faster completed as the viscosity of the curable composition (A1) except the solvents is lower (S. Reddy, R. T. Bonnecaze/Microelectronic Engineering, 82 (2005) 60-70). Accordingly, when the curable composition (A1) containing the polyfunctional (meth) acrylic monomer represented by the general formula (1) as the polymerizable compound (a) component is used, the optical nanoimprint lithography can be carried out with a high throughput.

Examples of the polyfunctional (meth)acrylic monomer represented by the general formula (1) include, for example, phenylethylene glycol diacrylate (PhEDA) represented by the following general formula (2) and 2-phenylpropan-1,3-diyl diacrylate (PhPDA) represented by the following general formula (3).

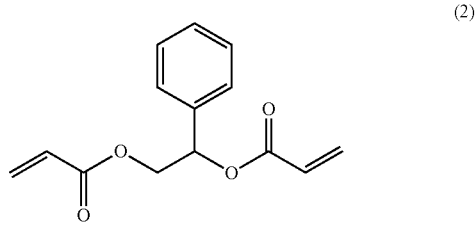

(2)

-continued (3)

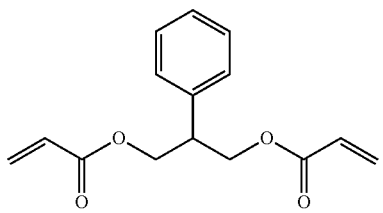

PhEDA can be synthesized according to such a synthetic scheme as described in, for example, the following general formula (4).

(4)

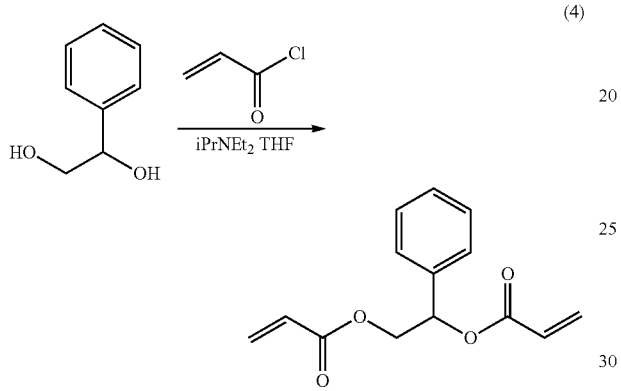

PhPDA can be synthesized according to such a synthetic scheme as described in, for example, the following general formula (5).

(5)

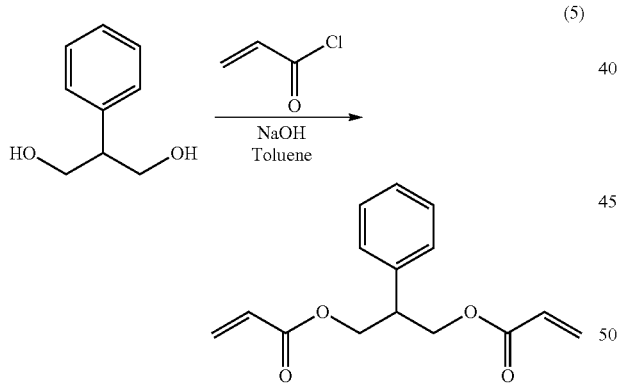

The curable composition (A1) according to this embodiment contains, as a polymerizable compound, a polyfunctional (meth)acrylic monomer represented by the following general formula (6) as the polymerizable compound (a).

(6)

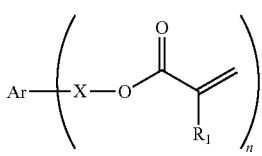

In the general formula (6), Ar denotes a monovalent, divalent, trivalent or tetravalent aromatic group which may have a substituent, X represents a single bond or an organic linking group, R1 denotes an alkyl group which may have a substituent or a hydrogen atom, n is an integer of 1, 2, 3 or 4. Incidentally, n is favorably an integer of 1 or 2.

The cured film of the curable composition (A1) according to this embodiment which contains the polyfunctional (meth)acrylic monomer represented by the general formula (6) as the polymerizable compound has high dry etching resistance.

Examples of the polyfunctional (meth)acrylic monomer represented by the general formula (6) include acrylic monomers represented by the following general formula (7-10).

(7)

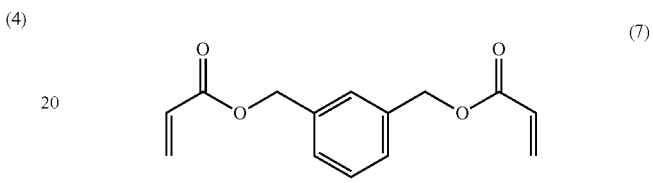

(8)

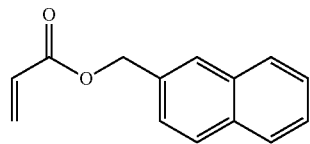

(9)

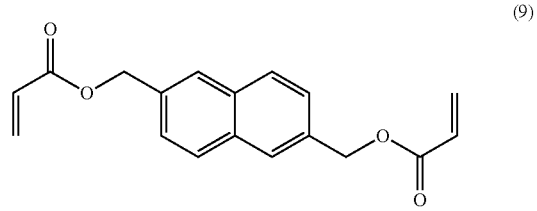

(10)

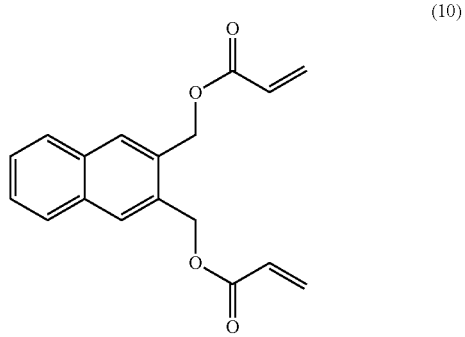

Incidentally, the curable composition (A1) according to this embodiment may also contain any other compound than the polyfunctional (meth)acrylic monomer represented by the general formula (1) as the polymerizable compound (a) component.

For example, regarding the curable composition (A1) according to this embodiment, examples of a monofunctional (meth)acrylic compound having an acryloyl group or a methacryloyl group as the component (a) include phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenyl (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonyl phenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxydiethylene glycol (meth)acrylate, polyethylene glycol mono(meth)acrylate, polypropylene glycol mono(meth)acrylate, methoxyethylene glycol (meth)acrylate, ethoxyethyl (meth)acrylate, methoxypolyethylene glycol (meth)acrylate, methoxypolypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, N,N-dimethylaminopropyl (meth)acrylamide and the like, though not limited thereto.

Commercial products of the above-described monofunctional (meth)acrylic compound include ARONIX (registered trademark): M101, M102, M110, M111, M113, M117, M5700, TO-1317, M120, M150 and M156 (all, products of TOAGOSEI CO., LTD.), MEDOL 10, MIBDOL 10, CHDOL 10, MMDOL 30, MEDOL 30, MIBDOL 30, CHDOL 30, LA, IBXA, 2-MTA and HPA, and VISCOAT: #150, #155, #158, #190, #192, #193, #220, #2000, #2100 and #2150 (all, products of OSAKA ORGANIC CHEMICAL INDUSTRY LTD.), LIGHT ACRYLATE: BO-A, EC-A, DMP-A, THF-A, HOP-A, HOA-MPE, HOA-MPL, PO-A, P-200A, NP-4EA and NP-BEA, and EPDXYESTER M-600A (all, products of KYOEISHA CHEMICAL Co., LTD.), KAYARAD (registered trademark): TC110S, R-564 and R-128H (all, products of Nippon Kayaku Co., Ltd.), NK ESTER: AMP-10G and AMP-20G (both, products of SHIN-NAKAMURA CHEMICAL CO., LTD.), FA-511A, 512A and 513A (all, products of Hitachi Chemical Co., Ltd.), PHE, CEA, PHE-2, PHE-4, BR-31, BR-31M and BR-32 (all, products of DKS Co., Ltd.), VP (product of BASF), ACMO, DMAA and DMAPAA (all, products of KOHJIN Co., Ltd.), and the like, though not limited thereto.

In addition, examples of the polyfunctional (meth)acrylic compound having two or more acryloyl groups or methacryloyl groups include trimethylolpropane di(meth)acrylate, trimethylolpropane tri(meth)acrylate, EO-modified trimethylolpropane tri(meth)acrylate, PO-modified trimethylolpropane tri(meth)acrylate, EO- and PO-modified trimethylolpropane tri(meth)acrylate, dimethylol-tricyclodecane di(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butandiol di(meth)acrylate, 1,6-hexandiol di(meth)acrylate, neopentyl glycol di(meth)acrylate, 1,9-nanondiol di(meth)acrylate, 1,10-decandiol di(meth)acrylate, 1,3-adamantanedimethanol di(meth)acrylate, tris(2-hydroxyethyl)-isocyanurate tri(meth)acrylate, tris(acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)-phenyl)propane, PO-modified 2,2-bis(4-((meth)acryloxy)-phenyl)propane, EO- and PO-modified 2,2-bis(4-((meth)acryloxy)phenyl)propane, and the like, though not limited thereto.

Commercial products of the above-described polyfunctional (meth)acrylic compound include UPIMER (registered trademark): UV SA1002 and SA2007 (both, products of Mitsubishi Chemical Co., Ltd.), VISCOAT: #195, #230, #215, #260, #335HP, #295, #300, #360 #700, GPT and 3PA (all, products of OSAKA ORGANIC CHEMICAL INDUSTRY LTD.), LIGHT ACRYLATE: 4-EG-A, 9EG-A, NP-A, DCP-A, BP-4EA, BP-4PA, TMP-A, PE-3A, PE-4A and DPE-6A (all, products of KYOEISHA CHEMICAL Co., LTD.), KAYARAD (registered trademark): PET-30, TMPTA, R-604, DPHA, DPCA-20, -30, -60 and -120, HX-620, D-310, and D-330 (all, products of Nippon Kayaku Co., Ltd.), ARONIX (registered trademark): M208, M210, M215, M220, M240, M305, M309, M310, M315, M325 and M400 (all, products of TOAGOSEI CO., LTD.), RIPDXY (registered trademark): VR-77, VR-60 and VR-90 (all, products of SHOWA DENKO K.K.), and the like, though not limited thereto.

Incidentally, in the group of the above-described compounds, (meth)acrylate means an acrylate or a methacrylate having an alcohol residue equivalent thereto. The (meth)acryloyl group means an acryloyl group or a methacryloyl group having an alcohol residue equivalent thereto. EO denotes ethylene oxide, and EO-modified Compound A denotes a compound in which a (meth)acrylic acid residue and an alcohol residue of Compound A are bonded through a block structure of an ethylene oxide group. In addition, PO denotes propylene oxide, and PO-modified Compound B denotes a compound in which a (meth)acrylic acid residue and an alcohol residue of Compound B are bonded through a block structure of a propylene oxide group.

<Component (b): Photopolymerization Initiator>

The component (b) is a photopolymerization initiator.

The photopolymerization initiator in the present specification is a compound which senses light having a predetermined wavelength to generate the above-described polymerizing agent (radical). Specifically, the photopolymerization initiator is a polymerization initiator (radical generator) generating a radical by virtue of light (infrared ray, visible ray, ultraviolet ray, far-ultraviolet ray, X-ray, charged particle ray such as electron ray, or radial ray).

The component (b) may be made up of one kind of a photopolymerization initiator, or may also be made up of plural kinds of photopolymerization initiators.

Examples of the radical generator include 2,4,5-triarylimidazole dimers which may have a substituent, such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer and a 2-(o- or p-methoxyphenyl)-4,5-diphenylimidazole dimer; benzophenone derivatives such as benzophenone, N,N'-tetramethyl-4,4'-diaminobenzophenone (Michler ketone), N,N'-tetraethyl-4,4'-diaminobenzophenone, 4-methoxy-4'-dimethylaminobenzophenone, 4-chlorobenzophenone, 4,4'-dimethoxybenzophenone and 4,4'-diaminobenzophenone;

cc-amino aromatic ketone derivatives such as 2-benzyl-2-dimethylamino-1-(4-morpholinophenyl)-butanone-1 and 2-methyl-1-[4-(methylthio)phenyl]-2-morpholino-propan-1-one; quinones such as 2-ethylanthraquinone, phenanthrenequinone, 2-t-butyl-anthraquinone, octamethylanthraquinone, 1,2-benz-anthraquinone, 2,3-benzanthraquinone, 2-phenylanthraquinone, 2,3-diphenylanthraquinone, 1-chloroanthraquinone, 2-methyl-anthraquinone, 1,4-naphtoquinone, 9,10-phenantharaquinone, 2-methyl-1,4-naphthoquinone and 2,3-dimethylanthraquinone; benzoin ether derivatives such as benzoin methyl ether, benzoin ethyl ether and benzoin phenyl ether; benzoin derivatives such as benzoin, methylbenzoin, ethylbenzoin and propylbenzoin; benzyl derivatives such as benzyl dimethyl ketal; acridine derivatives such as 9-phenylacridine and 1,7-bis(9,9'-acridinyl)heptane; N-phenylglycine derivatives such as N-phenylglycine; acetophenone derivatives such as acetophenone, 3-methylacetophenone, acetophenone benzyl ketal, 1-hydroxychclohexyl phenyl ketone, 2,2-dimethoxy-2-phenylacetophenone; thioxanthone derivatives such as thioxanthone, diethylthioxanthone, 2-isopropylthioxanthone and 2-chlorothioxantone; acylphosphine oxide derivatives such as 2,4,6-trimethylbenzoyldiphenylphosphine oxide, bis(2,4,6-trimethylbenzoyl)phenylphosphine oxide and bis-(2,6-dimethoxybenzoyl)-2,4,4-trimethylpentylphosphine oxide; oxime ester derivatives such as 1,2-octanedione, 1-[4-(phenylthio)-,2-(O-benzoyloxime)], ethanone and 1-[9-ethyl-6-(2-methylbenzoyl)-9H-carb azol-3-yl]-,1-(O-acetyloxime); xanthone, fluorenone, benzaldehyde, fluorene, anthraquinone, triphenylamine, carbazole, 1-(4-isopropyl-phenyl)-2-hydroxy-2-methylpropan-1-one and 2-hydroxy-2-methyl-1-phenylpropan-1-one; and the like, though not limited thereto.

Commercial products of the above-described radical generator include Irgacure: 184, 369, 651, 500, 819, 907, 784, 2959, CGI-1700, -1750, -1850 and CG24-61, Darocur: 1116 and 1173, and Lucirin (registered trademark): TPO, LR8893 and LR8970 (all, products of BASF), Uvecryl P36 (product of UCB), and the like, though not limited thereto.

Among these, the component (b) is favorably an acylphosphine oxide-based polymerization initiator. Incidentally, the acylphosphine-oxide-based polymerization initiators among the above-described examples are acylphosphine oxide compounds such as 2,4,6-trimethylbenzoyldiphenylphosphine oxide, bis(2,4,6-trimethylbenzoyl)phenylphosphine oxide and bis-(2,6-dimethoxybenzoyl)-2,4,4-trimethylpentylphosphine oxide.

The compounding proportion of the component (b) which is the photopolymerization initiator in the curable compositions (A1) and (A2) is favorably 0.1% by weight or more to 50% by weight or less based on the total of the component (a), the component (b) and a component (c) which will be described later, that is, the total weight of all the components except solvent component (d). The proportion is more favorably 0.1% by weight or more to 20% by weight or less, still more favorably more than 10% by weight and 20% by weight or less.

The compounding proportion of the component (b) is controlled to 0.1% by weight or more based on the total of the component (a), the component (b) and the component (c), whereby the curing rate of the resulting composition can be made fast to improve the reaction efficiency. In addition, the compounding proportion of the component (b) is controlled to 50% by weight or less based on the total of the component (a), the component (b) and the component (c), whereby the resulting cured film can be made a cured film having a certain degree of mechanical strength.

<Component (c): Non-Polymerizable Compound>

The curable compositions (A1) and (A2) according to this embodiment may additionally contain a non-polymerizable compound as a component (c) within such a range as not to impair the effect of the present invention according to various purposes, in addition to the above-described component (a) and component (b). As such a component (c), there is mentioned a compound which does not have a polymerizable functional group such as a (meth)acryloyl group and has no capability of sensing light having a predetermined wavelength to generate the above-described polymerizing agent (radical). Examples thereof include a sensitizer, a hydrogen donor, an internal mold release agent, a surfactant, an antioxidant, a polymer component, other additives, and the like. Plural kinds of the above-described compounds may be contained as the component (c).

The sensitizer is a compound suitably added for the purpose of promoting polymerization reaction and improving conversion rate in the reaction. Examples of the sensitizer include sensitizing dyes.

The sensitizing dye is a compound which is excited by absorbing light having a specific wavelength and interacts with the photopolymerization initiator which is the component (b). Incidentally, the interaction described herein is energy transfer, electron transfer or the like from the sensitizing dye in an excited state to the photopolymerization initiator which is the component (b).

Specific examples of the sensitizing dye include anthracene derivatives, anthraquinone derivatives, pyrene derivatives, perylene derivatives, carbazole derivatives, benzophenone derivatives, thioxanthone derivatives, xanthone derivatives, coumalin derivatives, phenothiazine derivatives, camphorquinone derivatives, acridine dyes, thiopyrylium salt dyes, merocyanine dyes, quinoline dyes, styrylquinoline dyes, ketocoumalin dyes, thioxanthene dyes, xanthene dyes, oxonol dyes, cyanine dyes, Rhodamine dyes, pyrylium salt dyes and the like, though not limited thereto.

The sensitizers may be used either singly or in any combination thereof.

The hydrogen donor is a compound which reacts with an initiation radical generated from the photopolymerization initiator which is the component (b) or a radical at a polymerization growth terminal to generate a radical higher in reactivity. It is favorably added when the photopolymerization initiator which is the component (b) is a photoradical generator.

Specific examples of such a hydrogen donor include amine compounds such as n-butylamine, di-n-butylamine, tri-n-butylphosphine, allylthiourea, s-benzylisothiouronium-p-toluene sulfinate, triethylamine, diethylaminoethyl methacrylate, triethylenetetramine, 4,4'-bis(dialkylamino) benzophenone, ethyl N,N-dimethylaminobenzoate, isoamyl N,N-dimethylaminobenzoate, pentyl-4-dimethylaminobenzoate, triethanolamine and N-phenylglycine, mercapto compounds such as 2-mercapto-N-phenylbenzoimidazole and mercaptopropionic acid esters, and the like, though not limited thereto.

The hydrogen donors may be used either singly or in any combination thereof. In addition, the hydrogen donor may also have a function as a sensitizer.

An internal mold release agent may be added into the curable composition for the purpose of reducing interfacial bonding force between a mold and a resist, that is, reducing releasing force in a mold releasing step which will be described later. The internal type in the present specification means that the release agent is added into the curable composition in advance prior to the arranging step of the curable composition.

Surfactants such as a silicone-based surfactant, a fluorine-based surfactant and a hydrocarbon-based surfactant, and the like may be used as the internal release agent. Incidentally, the internal mold release agent in the present invention does not have polymerizability.

The fluorine-based surfactant includes polyalkylene oxide adducts of an alcohol having a perfluoroalkyl group (polyethylene oxide, polypropylene oxide or the like), polyalkylene oxide adducts of a perfluoropolyether (polyethylene oxide, polypropylene oxide or the like), and the like. Incidentally, the fluorine-based surfactant may have a hydroxyl group, an alkoxy group, an alkyl group, an amino group, a thiol group or the like in a part (for example, a terminal group) of its molecular structure.

A commercial product may also be used as the fluorine-based surfactant. Examples of the commercial product include MEGAFAC (registered trademark): F-444, TF-2066, TF-2067 and TF-2068 (all, products of DIC Corporation), FLUORAD: FC-430 and FC-431 (both, products of Sumitomo 3M Limited), SURFLON (registered trademark) S-382 (product of AGC), EFTOP: EF-122A, 122B, 122C, EF-121, EF-126, EF-127 and MF-100 (all, products of Tohkem Products Corp.), PF-636, PF-6320, PF-656 and PF-6520 (all, products of OMNOVA Solutions), UNIDYNE (registered trademark): DS-401, DS-403 and DS-451 (all, products of DAIKIN INDUSTRIES, LTD.), FTERGENT (registered trademark): 250, 251, 222F and 208G (all, products of NEOS COMPANY LIMITED), and the like.

In addition, the internal mold release agent may also be the hydrocarbon-based surfactant.

The hydrocarbon-based surfactant includes an alkyl alcohol polyalkylene oxide adduct obtained by adding an alkylene oxide having 2 to 4 carbon atoms to an alkyl alcohol having 1 to 50 carbon atoms, and the like.

The alkyl alcohol polyalkylene oxide adduct includes a methyl alcohol ethylene oxide adduct, an decyl alcohol ethylene oxide adduct, a lauryl alcohol ethylene oxide adduct, a cetyl alcohol ethylene oxide adduct, a stearyl alcohol ethylene oxide adduct, a stearyl alcohol ethylene oxide/propylene oxide adduct and the like. Incidentally, the terminal group of the alkyl alcohol polyalkylene oxide adduct is not limited to a hydroxyl group which can be prepared by simply adding a polyalkylene oxide to an alkyl alcohol. This hydroxyl group may also be substituted by another substituent, for example, a polar functional group such as a carboxyl group, an amino group, a pyridyl group, a thiol group or a silanol group, or a hydrophobic functional group such as an alkyl group or an alkoxy group.

A commercial product may also be used as the alkyl alcohol polyalkylene oxide adduct. Examples of the commercial product include polyoxyethylene methyl ethers (methyl alcohol ethylene oxide adducts) (BLAUNON: MP-400, MP-550 and MP-1000) produced by AOKI OIL INDUSTRIAL CO., LTD., polyoxyethylene decyl ethers (decyl alcohol ethylene oxide adducts) (FINESURF: D-1303, D-1305, D-1307 and D-1310) produced by AOKI OIL INDUSTRIAL CO., LTD., a polyoxyethylene lauryl ether (lauryl alcohol ethylene oxide adduct) (BLAUNON EL-1505) produced by AOKI OIL INDUSTRIAL CO., LTD., polyoxyethylene cetyl ethers (cetyl alcohol ethylene oxide adducts) (BLAUNON: CH-305 and CH-310) produced by AOKI OIL INDUSTRIAL CO., LTD., polyoxyethylene stearyl ethers (stearyl alcohol ethylene oxide adducts) (BLAUNON: SR-705, SR-707, SR-715, SR-720, SR-730 and SR-750) produced by AOKI OIL INDUSTRIAL CO., LTD., random polymer type polyoxyethylene polyoxypropylene stearyl ethers (BLAUNON: SA-50/50 1000R and SA-30/70 2000R) produced by AOKI OIL INDUSTRIAL CO., LTD., a polyoxyethylene methyl ether (Pluriol (registered trademark) A760E) produced by BASF, polyoxyethylene alkyl ethers (EMULGEN series) produced by Kao Corporation, and the like.

Among these hydrocarbon-based surfactants, alkyl alcohol polyalkylene oxide adducts are favorable as the internal mold release agent, and long-chain alkyl alcohol polyalkylene oxide adducts are more favorable.

The internal mold release agents may be used either singly or in any combination thereof.

The compounding proportion of the component (c) which is the non-polymerizable compound in the curable compositions is favorably 0% by weight or more to 50% by weight or less based on the total of the component (a), the component (b) and a component (c) which will be described later, that is, the total weight of all the components except the solvents. The proportion is more favorably 0.1% by weight or more to 50% by weight or less, still more favorably 0.1% by weight or more to 20% by weight or less.

The compounding proportion of the component (c) is controlled to 50% by weight or less based on the total of the component (a), the component (b) and the component (c), whereby the resulting cured film can be made a cured film having a certain mechanical strength.

<Component (d): Solvent>

The curable compositions according to this embodiment may also contain a solvent as a component (d). No particular limitation is imposed on the component (d) so long as it is a solvent dissolving the component (a), the component (b) and the component (c) therein. A favorable solvent is a solvent having a boiling point of 80° C. or more to 200° C. or less under an atmospheric pressure. A solvent having at least one of an ester structure, a ketone structure, a hydroxyl group and an ether structure is more favorable. Specifically, the solvent is a simple solvent selected from propylene glycol monomethyl ether acetate, propylene glycol monomethyl ether, cyclohexanone, 2-heptanone, γ-butyro-lactone and ethyl lactate or a mixed solvent thereof.

The curable composition (A1) according to this embodiment favorably contains the component (d) because a spin coating method is favorable as a coating method of the curable composition (A1) on the substrate as described below.

<Temperature upon Compounding of Curable Composition>

When the curable compositions (A1) and (A2) according to this embodiment are prepared, at least the component (a) and the component (b) are mixed and dissolved under predetermined temperature conditions. Specifically, the preparation is conducted within a range of 0° C. or more to 100° C. or less. The same shall apply to the case where the component (c) and the component (d) are contained.

<Viscosity of Curable Composition>

The curable compositions (A1) and (A2) according to this embodiment are favorably liquid because the spread and fill of the curable composition (A1) and/or (A2) in a mold contact step which will be described later are promptly completed, that is, the filling time becomes short.

The viscosity at 25° C. of a mixture of the components except the solvents (component (d)) in the curable composition (A1) according to this embodiment is favorably 1 mPa·s or more to 1000 mPa·s or less. In addition, the viscosity is more favorably 1 mPa·s or more to 500 mPa·s or less, still more favorably 1 mPa·s or more to 100 mPa·s or less.

The viscosity at 25° C. of a mixture of the components except the solvents (component (d)) in the curable composition (A2) according to this embodiment is favorably 1 mPa·s or more to 100 mPa·s or less. In addition, the viscosity is more favorably 1 mPa·s or more to 50 mPa·s or less, still more favorably 1 mPa·s or more to 12 mPa·s or less.

The viscosities of the curable compositions (A1) and (A2) are controlled to 100 mPa·s or less, whereby the spread and fill are promptly completed when the curable compositions (A1) and (A2) are brought into contact with the mold (S. Reddy, R. T. Bonnecaze/Microelectronic Engineering, 82 (2005) 60-70). Accordingly, when the curable compositions according to this embodiment are used, the optical nanoimprint lithography can be carried out with a high throughput. In addition, a pattern defect due to filling failure is hard to occur.

In addition, the viscosities are controlled to 1 mPa·s or more, whereby uneven coating is hard to occur when the curable compositions (A1) and (A2) are applied on to the substrate. Further, the curable compositions (A1) and (A2) are hard to flow out of an end portion of the mold when the curable compositions (A1) and (A2) are brought into contact with the mold.

<Surface Tension of Curable Composition>

The surface tensions of the curable compositions (A1) and (A2) according to this embodiment are favorably 5 mN/m or more to 70 mN/m or less in terms of the surface tension at 23° C. of a composition of the components except the solvents (component (d)). In addition, the surface tensions are more favorably 7 mN/m or more to 50 mN/m or less, still more favorably 10 mN/m or more to 40 mN/m or less. Here, when the surface tensions become higher, for example, 5 mN/m or more, capillary force more strongly acts, so that the filling (spread and fill) is completed in a short time when the curable composition (A1) and/or (A2) is brought into contact with the mold (S. Reddy, R. T. Bonnecaze/Microelectronic Engineering, 82 (2005) 60-70).

In addition, the surface tensions are controlled to 70 mN/m or less, whereby a cured film obtained by curing the curable compositions becomes a cured film having good surface smoothness.

In this embodiment, the surface tension of the curable composition (A1) except the solvents (component (d)) is favorably higher than the surface tension of the curable composition (A2) except the solvents. The reason for this is that the prespread of the curable composition (A2) is accelerated (the droplet spreads over a wide range) owing to a Marangoni effect which will be described later prior to the mold contact step, the time required for the spread in the mold contact step which will be described later is shortened, and consequently the filling time is shortened.

The Marangoni effect is a phenomenon of free surface movement attributable to a topical difference between surface tensions of liquids (N. Shiraishi/Int. J. Microgravity Sci. No. 31 Supplement 2014 (S5-S12)). A liquid of low surface tension diffuses by using surface tension, i.e., the difference in surface energy, as driving force so as to cover a wider surface. That is, when the curable composition (A2) with low surface tension is dropped after the curable composition (A1) with high surface tension is applied to the whole surface of the substrate, the prespread of the curable composition (A2) is accelerated.

<Contact Angle of Curable Composition>

The contact angles of the curable compositions (A1) and (A2) according to this embodiment with respect to both of the surface of the substrate and the surface of the mold are favorably 0° or more to 90° or less in terms of the compositions of the components except the solvents (component (d)). If the contact angle is more than 90°, capillary force acts in a negative direction (direction of shrinking a contact interface between the mold and the curable composition) in the interior of a mold pattern or a space between the substrate and the mold, and so the filling fails. The contact angles are particularly favorably 0° or more to 30° or less. The capillary force more strongly acts as the contact angle is lower, and so the filling rate becomes fast (S. Reddy, R. T. Bonnecaze/Microelectronic Engineering, 82 (2005) 60-70).

<Impurity Contaminated in Curable Composition>

The curable compositions (A1) and (A2) according to this embodiment favorably contain impurities as little as possible. The impurities described herein mean components other than the above-described component (a), component (b), component (c) and component (d).

Accordingly, the curable compositions according to this embodiment are favorably those obtained through a purifying step. For example, filtration using a filter is favorable as such a purifying step.

When the filtration using the filter is conducted, it is specifically favorable that the above-described component (a) and component (b), and additive components added as necessary are mixed, and the resultant mixture is then filtered through a filter having a pore size of, for example, 0.001 μm or more to 5.0 μm or less. When the filtration using the filter is conducted, it is more favorable to conduct the filtration in multi-stages or repeatedly plural times. In addition, the resultant filtrate may also be filtered again. A plurality of filters different in pore size may also be used to conduct the filtration. A filter made of a polyethylene resin, a polypropylene resin, a fluororesin, a nylon resin or the like may be used as the filter used in the filtration, though not particularly limited thereto.

The impurities contaminated in the curable compositions, such as particles, can be removed through such a purifying step, thereby preventing the cured film obtained after curing the curable compositions from carelessly creating irregularities due to the impurities such as particles to cause a pattern defect.

Incidentally, when the curable compositions according to this embodiment are used for producing a semiconductor integrated circuit, it is favorable to avoid contamination of impurities (metallic impurities) containing a metal atom into the curable compositions to the utmost so as not to inhibit the operation of the resultant product. In such a case, the concentration of the metallic impurities contained in the curable compositions is favorably reduced to 10 ppm or less, more favorably 100 ppb or less.

<Pattern Forming Method>

The pattern forming method according to this embodiment is then described with reference to the schematic sectional views illustrated in FIGS. 2A1 to 2E and FIGS. 3A to 3C.

The pattern forming method according to this embodiment is a mode of the optical nanoimprint lithography. The pattern forming method according to this embodiment has a coating step 1 (FIGS. 2A1, 2A2) of coating the above-described curable composition (A1) according to this embodiment on a substrate, a coating step 2 (FIGS. 2B1, 2B2) of coating a curable composition (A2) on the layer of the curable composition (A1), a mold contact step (FIG. 2C) of sandwiching between a mold and the substrate a layer in which the curable composition (A1) and the curable composition (A2) are partially mixed, a light irradiation step (FIG. 2D) of curing the layer in which the two curable compositions are partially mixed all at once by applying light from the side of the mold, and a mold releasing step (FIG. 2E) of separating the mold from the layer formed of the cured curable compositions.

A cured film obtained by the production method for a cured film having a pattern form according to this embodiment is favorably a film having a pattern of a size of 1 nm or more to 10 mm or less. In addition, a film having a pattern of a size of 10 nm or more to 100 μm or less is more favorable. Incidentally, a pattern forming technique for preparing a film having a pattern (uneven structure) of a nanosize (1 nm or more to 100 nm or less) by utilizing light is generally called optical nanoimprint lithography. The pattern forming method according to this embodiment utilizes the optical nanoimprint lithography.

The respective steps will hereinafter be described.

<Coating Step 1 (FIGS. 2A1, 2A2)>

In this step (coating step 1), the above-described curable composition (A1) 202 according to this embodiment is laminated on (applied to) the substrate 201 as illustrated in FIGS. 2A1, 2A2 to form a coating film.

The substrate 201 which is an object on which the curable composition (A1) 202 is arranged is a processing object substrate, and a silicon wafer is generally used. A processing object layer may also be formed on the substrate 201. Another layer may also be additionally formed between the substrate 201 and the processing object layer. In addition, when a quartz substrate is used as the substrate 201, a replica (mold replica) of a quartz imprint mold can be fabricated.

However, the substrate 201 is not limited to the silicon wafer or the quartz substrate in the present invention. The substrate 201 may be optionally selected from among those known as substrates for semiconductor devices, such as aluminum, titanium-tungsten alloys, aluminum-silicon alloys, aluminum-copper-silicon alloys, silicon oxide and silicon nitride.

Incidentally, the surface of the substrate 201 (processing object substrate) or processing object layer used may also be subjected to a surface treatment such as a silane coupling treatment, a silazane treatment or formation of an organic thin film to improve its adhesion to the curable compositions (A1) and (A2).

As a method for arranging the curable composition (A1) 202 on the substrate 201 or the processing object layer in this embodiment, for example, an ink jet method, a dip coating method, an air knife coating method, a curtain coating method, a wire bar coating method, a gravure coating method, an extrusion coating method, a spin coating method, a slit-scan method or the like may be used. The spin coating method is particularly favorable in the present invention.

When the curable composition (A1) 202 is arranged on the substrate 201 or the processing object layer by means of the spin coating method, a baking step may be carried out as needed to volatilize the solvent component (d).

Incidentally, the average film thickness of the curable composition (A1) 202 is, for example, 0.1 nm or more to 10,000 nm or less, favorably 1 nm or more to 20 nm or less, particularly favorably 1 nm or more to 10 nm or less, though it varies according to use application.

<Coating Step 2 (FIGS. 2B1, 2B2)>

In this step (coating step 2), it is favorable to dispersedly drop and arrange droplets of the curable composition (A2) 203 on the layer of the curable composition (A1) as illustrated in FIG. 2B1, 2B2). An ink jet method is particularly favorable as an arranging method. The droplets of the curable composition (A2) 203 are arranged densely on the substrate opposing to a region in which depressed portions are densely present on a mold and arranged sparsely on the substrate opposing to a region in which the depressed portions are sparsely present. A remaining film which will be described later can be thereby controlled to an even thickness irrespective of sparseness and denseness of a pattern on the mold.

In the present invention, the droplets of the curable composition (A2) 203 arranged in this step (coating step 2) promptly spread owing to the Marangoni effect using the difference in surface energy (surface tension) as driving force as described above (prespread) (FIG. 2B1, 2B2)).

<Mold Contact Step (FIG. 2C)>

Figure 2C:
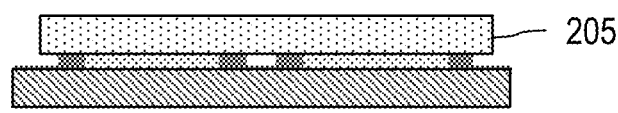
FIG. 2C illustrates schematic sectional views illustrating an optical nanoimprint lithography according to this embodiment of the present invention.

A mold 205 having a prototype pattern for transferring a pattern form is then brought into contact with the liquid in which the curable composition (A1) and the curable composition (A2) are partially mixed, which has been formed in the previous steps (coating steps 1 and 2), as illustrated in FIG. 2C. The liquid in which the curable composition (A1) and the curable composition (A2) are partially mixed is thereby filled into depressed portions of a fine pattern on the surface of the mold 205 to become a liquid film filled into the fine pattern of the mold.

A mold 205 made up of a light-transmitting material is favorably used as the mold 205 taking the next step (light irradiation step) into consideration. Specifically, glass, quartz, PMMA, a light-transmitting resin such as a polycarbonate resin, a transparent metal vapor deposited film, a soft film such as polydimethylsiloxane, a photo-cured film, a metal film or the like is favorable as the material making up the mold 205. When the light-transmitting resin is used as the material making up the mold 205, it is however necessary to select a resin which is not dissolved in the components contained in the curable compositions 205. The material making up the mold 205 is particularly favorably quartz because it is low in coefficient of thermal expansion and small in pattern distortion.

The fine pattern on the surface of the mold 205 favorably has a pattern height of 4 nm or more to 200 nm or less.

As the pattern height is lower, the force for separating the mold from a photo-cured film of a resist in a mold releasing step, i.e., releasing force becomes lower, and the number of release defects caused by a resist pattern which is teared off in association with mold releasing to remain on the side of a mask is small. Adjoining resist patterns come into contact with each other due to elastic deformation of the resist patterns by a shock upon the separation of the mold, and so the resist patterns may adhere to each other or be broken in some cases. When the pattern height is about twice or lower (aspect ratio: 2 or lower) as much as the pattern width, however, there is a high possibility that such defects may be avoided. When the pattern height is too low on the other hand, processing accuracy of the processing object substrate is low.

The mold 205 may also be subjected to a surface treatment prior to this step which is the mold contact step between the curable compositions (A1) and (A2) and the mold 205 for improving releasability between the curable compositions (A1) and (A2) and the surface of the mold 205. A method of applying a mold release agent to the surface of the mold 205 to form a mold release agent layer is mentioned as a method for the surface treatment. Here, as the mold release agent applied to the surface of the mold 205, there is mentioned a silicone-based mold release agent, a fluorine-based mold release agent, a hydrocarbon-based mold release agent, a polyethylene-based mold release agent, a polypropylene-based mold release agent, a paraffin-based mold release agent, a montan-based mold release agent, a carnauba-based mold release agent or the like. For example, a commercial mold release agent such as OPTOOL (registered trademark) DSX produced by DAIKIN INDUSTRIES, LTD. may also be favorably used. Incidentally, the mold release agents may be either singly or in any combination thereof. Among these, the fluorine-based and hydrocarbon-based mold release agents are particularly favorable.

When the mold 205 is brought into contact with the curable compositions (A1) and (A2) in this step (mold contact step) as illustrated in FIG. 2C, no particular limitation is imposed on the pressure applied to the curable compositions (A1) and (A2). The pressure may be controlled to 0 MPa or more to 100 MPa or less. In addition, the pressure is favorably 0 MPa or more to 50 MPa or less, more favorably 0 MPa or more to 30 MPa or less, and still more favorably 0 MPa or more to 20 MPa or less.

In the present invention, the prespread of the droplets of the curable composition (A2) 203 has exceeded in the previous step (coating step 2), so that the spread of the curable composition (A2) 203 in this step is promptly completed. In a boundary region between the droplets of the curable composition (A2) 203, the spread is lastly completed, and the concentration of the curable composition (A1) is high.

As described above, the spread and fill of the curable compositions (A1) and (A2) are promptly completed in this step, so that the time required for bringing the mold 205 into contact with the curable compositions (A1) and (A2) can be set short. Accordingly, the advantage that many pattern forming steps can be completed in a short time to attain high productivity is an effect of the present invention. Although the contact time is not particularly limited, it is better to set the time to, for example, 0.1 sec. or more to 600 sec. or less. In addition, the time is favorably 0.1 sec. or more to 3 sec. or less, particularly favorably 0.1 sec. or more to 1 sec. or less. If the time is less than 0.1 sec., the spread and fill become insufficient, and so a defect called an unfilled defect tends to occur frequently.

This step may be conducted under any of the conditions of an air atmosphere, a reduced pressure atmosphere and an inert gas atmosphere. However, the reduced pressure atmosphere and the inert gas atmosphere are favorable because the influence of oxygen and water on a curing reaction can be prevented. As specific examples of the inert gas usable in case where this step is conducted under the inert gas atmosphere, there are mentioned nitrogen, carbon dioxide, helium, argon and various kinds of Freon gases, and mixed gases thereof. When this step is conducted under an atmosphere of a specific gas including under the air atmosphere, a favorable pressure is 0.0001 atm or more to 10 atm or less.

The mold contact step may also be conducted under an atmosphere containing a condensable gas (hereinafter referred to as "the condensable gas atmosphere"). The condensable gas in the present specification denotes a gas which is condensed and liquefied by a capillary pressure generated upon filling when the gas in the atmosphere is filled together with the curable compositions (A1) and (A2) into a depressed portion of the fine pattern formed on the mold 205 and into a space between the mold and the substrate. Incidentally, the condensable gas is present as a gas in the atmosphere before the curable compositions (A1) and (A2) come into contact with the mold 205 in the mold contact step (FIGS. 2B1, 2B2).

When the mold contact step is conducted under the condensable gas atmosphere, the gas filled into the depressed portion of the fine pattern is liquefied by the capillary pressure generated by the curable compositions (A1) and (A2) to eliminate bubbles, so that the fillability is excellent. The condensable gas may also be dissolved in the curable composition (A1) and/or (A2).

The boiling point of the condensable gas is not limited so long as it is not more than an atmosphere temperature in the mold contact step. However, it is favorably -10° C. to 23° C., more favorably 10° C. to 23° C. When the boiling point falls within this range, the fillability is more excellent.

The vapor pressure of the condensable gas at the atmosphere temperature in the mold contact step is not limited so long as it is not more than the mold pressure upon stamping in the mold contact step. However, it is favorably 0.1 to 0.4 MPa. When the vapor pressure falls within this range, the fillability is more excellent. If the vapor pressure at the atmosphere temperature is more than 0.4 MPa, there is a tendency not to sufficiently achieve the bubble elimination effect. If the vapor pressure at the atmosphere temperature is less than 0.1 MPa on the other hand, pressure reduction is required, and so there is a tendency for an apparatus to become complicated.

No particular limitation is imposed on the atmosphere temperature in the mold contact step. However, it is favorably 20° C. to 25° C.

As specific condensable gases, there are mentioned chlorofluorocarbon (CFC) such as trichlorofluoromethane, fluorocarbon (FC), hydrochlorofluorocarbon (HCFC), hydrofluorocarbon (HFC) such as 1,1,1,3,3-pentafluoropropane ($CHF_2CH_2CF_3$, HFC-245fa, PFP), and Freons such as hydrofluoro-ether (HFE) such as pentafluoroethyl methyl ether ($CF_3CF_2OCH_3$, HFE-245mc).

Among these, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.) and pentafluoroethyl methyl ether are favorable from the viewpoint that the fillability at an atmosphere temperature of 20° C. to 25° C. in the mold contact step is excellent. Further, 1,1,1,3,3-pentafluoropropane is particularly favorable from the viewpoint of excellent safety.

The condensable gases may be used either singly or in any combination thereof. In addition, these condensable gases may also be used in combination with a non-condensable gas such as air, nitrogen, carbon dioxide, helium or argon. Helium is favorable as the non-condensable gas to be combined with the condensable gas from the viewpoint of fillability. Helium can permeate the mold 205. Therefore, when the gases (condensable gas and helium) in the atmosphere are filled together with the curable composition (A1) and/or (A2) into the depressed portion of the fine pattern formed on the mold 205 in the mold contact step, the condensable gas is liquefied, and helium permeates the mold.

<Light Irradiation Step (FIG. 2D)>

Figure 2D:
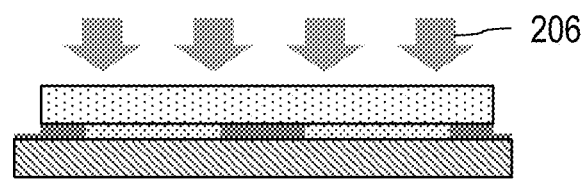
FIG. 2D illustrates schematic sectional views illustrating an optical nanoimprint lithography according to this embodiment of the present invention.

The layer in which the curable composition (A1) and the curable composition (A2) are partially mixed is then irradiated with light through the mold 205 as illustrated in FIG. 2D. More specifically, the curable composition (A1) and/or the curable composition (A2) filled into the fine pattern of the mold is irradiated with light through the mold 205. The curable composition (A1) and/or the curable composition (A2) filled into the fine pattern of the mold 205 is thereby cured by the applied light to become a cured film 207 having a pattern form.

Here, a light 206 to be applied to the curable composition (A1) and/or the curable composition (A2) filled into the fine pattern of the mold 205 is selected according to the sensitivity wavelengths of the curable compositions (A1) and (A2). Specifically, ultraviolet light having a wavelength of 150 nm or more to 400 nm or less, X-rays, electron rays or the like is favorably suitably chosen for use.

Among these, ultraviolet light is particularly favorable as the irradiation light 206. The reason for this is that a product commercially available as a curing aid (photo-polymerization initiator) is often a compound having sensitivity to the ultraviolet light. As examples of a light source for emitting the ultraviolet light, there are mentioned a high pressure mercury lamp, an ultrahigh pressure mercury lamp, a low pressure mercury lamp, a Deep-UV lamp, a carbon arc lamp, a chemical lamp, a metal halide lamp, a xenon lamp, a KrF excimer laser, an ArF excimer laser, an $F_2$ excimer laser and the like. However, the ultrahigh pressure mercury lamp is particularly favorable. The number of light sources used may be either singular or plural. In addition, the light irradiation may be conducted on the whole surface of the curable composition (A1) and/or (A2) filled in the fine pattern of the mold or on only a part region thereof.

In addition, the light irradiation may be conducted intermittently plural times in the whole region on the substrate or continuously in the whole region. Further, a part region A may be irradiated in a first irradiation process, and another region B than the region A may be irradiated in a second irradiation process.

<Mold Releasing Step (FIG. 2E)>

Figure 2E:
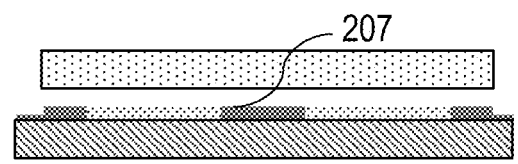
FIG. 2E illustrates schematic sectional views illustrating an optical nanoimprint lithography according to this embodiment of the present invention.

The cured film 207 having the pattern form is then separated from the mold 205. In this step (mold releasing step), the cured film 207 having the pattern form is separated from the mold 205 as illustrated in FIG. 2E to obtain a cured film 207 having a pattern form which becomes an inverted pattern of the fine pattern formed on the mold 205 in the step illustrated in FIG. 2D (light irradiation step) in a self-standing state. Incidentally, a cured film remains even in a depressed portion of the uneven pattern of the cured film 207 having the pattern form. This film is called a remaining film.

Incidentally, when the mold contact step is conducted under the condensable gas atmosphere, the condensable gas vaporizes in association with lowering of the pressure at an interface where the cured film 207 is in contact with the mold 205 when the cured film 207 is separated from the mold 205 in the mold releasing step, thereby tending to exhibit an effect to reduce the releasing force which is the force necessary for separating the cured film 207 from the mold 205.

A method for separating the cured film 207 having the pattern form from the mold 205 is not particularly limited so long as a part of the cured film 207 having the pattern form is not physically broken upon the separation, and various conditions and the like are also not particularly limited. For example, the separation may be conducted by fixing the substrate 201 (processing object substrate) to move the mold 205 so as to go away from the substrate 201 or by fixing the mold 205 to move the substrate 201 so as to go away from the mold 205. Alternatively, both of them may be pulled just in opposite directions to separate them from each other.

A cured film having a desired uneven pattern form (pattern form associated with the uneven form of the mold 205) at a desired position can be obtained by a series of steps (production process) having the above-described coating step 1 (FIGS. 2A1, 2A2) to mold releasing step (FIG. 2E).

In the production method for the film having the pattern form according to this embodiment, the curable composition (A1) is laminated all together on most of the surface of the substrate in the coating step 1 (FIGS. 2A1, 2A2), and a repeating unit (shot) including the coating step 2 (FIGS. 2B1, 2B2) to the mold releasing step (FIG. 2E) can be conducted repeatedly plural times on the same substrate. In addition, the coating step 1 (FIGS. 2A1, 2A2) to the mold releasing step (FIG. 2E) may also be conducted repeatedly plural times on the same substrate. A repeating unit (shot) including the coating step 1 (FIGS. 2A1, 2A2) to the mold releasing step (FIG. 2E) or the coating step 2 (FIGS. 2B1, 2B2) to the mold releasing step (FIG. 2E) is repeated plural times, whereby a cured film having a plurality of the desired uneven pattern forms (pattern forms associated with the uneven form of the mold 205) at desired positions on the processing object substrate can be obtained.

<Remaining Film Removing Step (FIG. 3B) of Removing a Part of Cured Film>

Figure 3A:
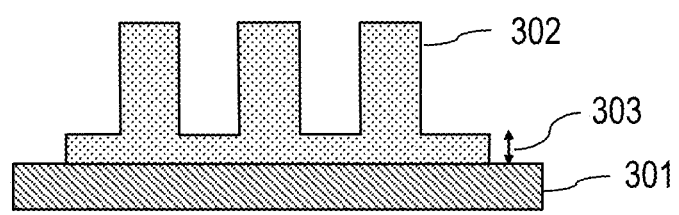
FIG. 3A illustrates schematic sectional views illustrating the optical nanoimprint lithography according to this embodiment of the present invention.
Figure 3B:
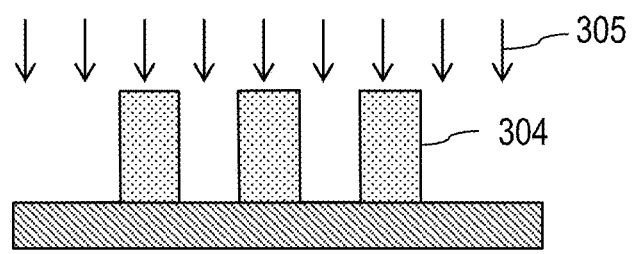
FIG. 3B illustrates schematic sectional views illustrating the optical nanoimprint lithography according to this embodiment of the present invention.

The cured film obtained by the mold releasing step (FIG. 2E) has the specific pattern form. However, a part of the cured film may remain in some cases even in another region than a region in which this pattern form is formed as illustrated in FIG. 3A (hereinafter, such a part of the cured film is referred to as "a remaining film 303"). In such a case, a cured film lying in a region to be removed (remaining film 303) of the resultant cured film having the pattern form is removed with an etching gas 1 or the like as illustrated in FIG. 3B, whereby a cured film pattern 304 having the desired uneven pattern form (pattern form associated with the uneven form of the mold 205 in FIGS. 2C to 2E) and having no remaining film can be obtained. A surface of the substrate 301 is exposed.

No particular limitation is imposed on a method for removing the remaining film 303, and any publicly known method, for example, dry etching using an etching gas A (305 in FIG. 3B) may be used. A publicly known dry etching apparatus may be used in the dry etching. The etching gas A (305 in FIG. 3B) is suitably selected according to the elemental composition of a cured film subjected to the etching. However, a halogen-based gas such as CF4, C2F6, C3F8, CCl2F2, CCl4, CBrF3, BCl3, PCl3, SF6 or Cl2, an oxygen atom-containing gas such as O2, CO or CO2, an inert gas such as He, N2 or Ar, an H2 or NH3 gas, or the like may be used. Incidentally, these gases may also be used in combination.

<Substrate Processing Step (FIG. 3C)>

The cured film pattern 304 without the remaining film is utilized as a resist film to conduct dry etching for a part of the substrate 301 whose surface has been exposed in the step of FIG. 3B. In the dry etching, a publicly known dry etching apparatus may be used. An etching gas B (306 in FIG. 3C) is suitably selected according to the elemental composition of the cured film subjected to the etching and the elemental composition of the substrate 301. However, a halogen-based gas such as CF4, C2F6, C3F8, CCl2F2, CCl4, CBrF3, BCl3, PCl3, SF6 or Cl2, an oxygen atom-containing gas such as O2, CO or CO2, an inert gas such as He, N2 or Ar, an H2 or NH3 gas, or the like may be used. Incidentally, these gases may also be used in combination. The etching gas A (305 in FIG. 3B) and the etching gas B (306 in FIG. 3C) may be the same or different from each other.

As illustrated in FIG. 2E, there is a possibility that concentration non-uniformity between the curable composition (A1) and the curable composition (A2) may occur in the cured film 207 having the pattern form. In the present invention, the curable composition (A1) has a dry etching resistance equal to or more than that of the curable composition (A2). Therefore, the substrate 301 can be successfully processed even in a region in which the concentration of the curable composition (A1) is high, and consequently the substrate 301 can be evenly processed.

Figure 3C:
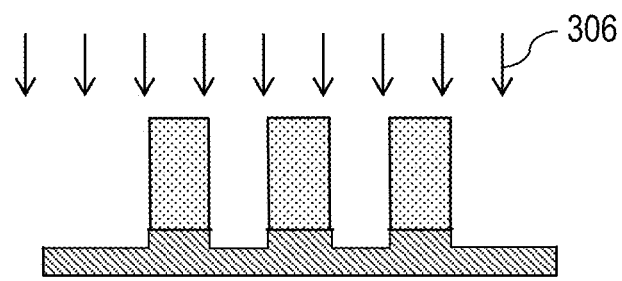
FIG. 3C illustrates schematic sectional views illustrating the optical nanoimprint lithography according to this embodiment of the present invention.

A circuit structure based on the pattern form associated with the uneven form of the mold 205 can be formed on the substrate 301 by forming an electronic component in addition to a series of steps (production process) having the above-described coating step 1 (FIGS. 2A1, 2A2) to substrate processing step (FIG. 3C). A circuit substrate utilized in a semiconductor element or the like can be thereby produced. Examples of the semiconductor element referred to here include LSI, system LSI, DRAM, SDRAM, RDRAM, D-RDRAM, NAND flash and the like. In addition, this circuit substrate is connected to a circuit controlling mechanism or the like of the circuit substrate, whereby an electronic device such as a display, a camera or a medical device can also be formed.

In addition, an optical component can also be obtained likewise by processing the substrate by the dry etching utilizing the cured product pattern 304 as the resist film.

In addition, a quartz substrate is used as the substrate 201, and the cured product pattern 304 is utilized as the resist film to process quartz by the dry etching, whereby a replica of a quartz imprint mold (mold replica) can also be fabricated.

Incidentally, when a substrate with a circuit or an electronic component is fabricated, the cured product pattern 304 may also be finally removed from a processed substrate, but a construction that the pattern remains as a member consisting a device may also be taken.

(Pretreatment Coating Material and a Set of Imprint Resist)

Another aspect of the present invention described above provides an imprint pretreatment coating material promoting spreading of a droplet component in a substrate surface direction by forming a liquid film as a pretreatment coating on the substrate followed by applying the droplet to the liquid film.

That is, the present invention includes an imprint pretreatment coating material promoting spreading of a droplet component in a substrate surface direction by forming a liquid film as a pretreatment coating on the substrate followed by applying the droplet to the liquid film, wherein the imprint pretreatment coating material contains at least a compound represented by the following general formula (1) as the polymerizable compound (a1):

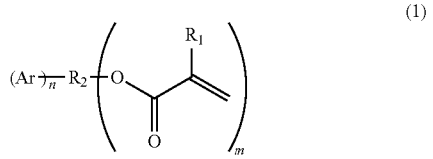

(1)

In the general formula (1), Ar denotes a monovalent aromatic group which may have a substituent, R1 denotes an alkyl group which may have a substituent or a hydrogen atom, R2 denotes an (m+n)-valent alkyl group which may have a substituent, m is an integer of 2 or more, and n is an integer of 1 or more.

In addition, the present invention includes an imprint pretreatment coating material promoting spreading of a droplet component in a substrate surface direction by forming a liquid film as a pretreatment coating on the substrate followed by applying the droplet to the liquid film, wherein the imprint pretreatment coating material contains at least a compound represented by the following general formula (6) as the polymerizable compound (a1):

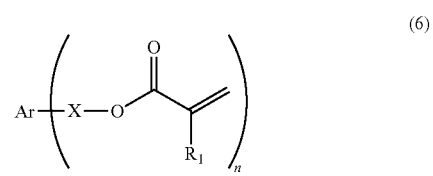

(6)

In the general formula (6), Ar denotes a monovalent, divalent, trivalent or tetravalent aromatic group which may have a substituent, X represents a single bond or an organic linking group, R1 denotes an alkyl group which may have a substituent or a hydrogen atom, n is an integer of 1, 2, 3 or 4.

The surface tension of the pretreatment coating is favorably higher than the surface tension of the droplet applied.

Especially, the surface tension of the imprint pretreatment coating material except solvents is favorably higher than the surface tension of the imprint resist except solvents.

Thereby, the spreading of a droplet component in the substrate surface direction is promoted by applying the droplet to the liquid film, and then, a favorable imprint can be achieved.

Especially, the imprint resist and the pretreatment coating material are preferably provided as a set.

That is, a favorable imprint can be achieved by the imprint resist and the pretreatment coating material being provided as a set where the surface tension of the imprint pretreatment coating material except solvents is higher than the surface tension of the imprint resist except solvents.

Furthermore, a set where the difference between the surface tension of the imprint pretreatment coating material and the surface tension of the imprint resist is 1 mN/m or more to 25 mN/m or less is more preferable.

In addition, another aspect of the present invention provides a favorable pretreatment method for a substrate to conduct an imprint by coating a pretreatment coating material on the substrate.

In addition, the present invention includes a pattern forming method for forming a pattern on a substrate. The pattern forming method according to the present invention includes a step of dropping a resist dispersedly on a substrate coated by the pretreatment coating material, thereby the spreading of a resist component in the substrate surface direction is promoted and the time required for the imprint can be shortened.

EXAMPLES

The present invention will hereinafter be described in more detail by Examples. However, the technical scope of the present invention is not limited to Examples described below. Incidentally, "part(s)" and "%" as will be used hereinafter are based by weight unless expressly noted.

Example 1

(1) Preparation of Curable Composition (A1-1)

The following component (a1), component (b1), component (c1) and component (d1) were compounded, and this compound was filtered through an ultra-high-molecular-weight polyethylene-made filter of 0.2 μm to prepare a curable composition (A1-1) of Example 1.

(1-1) Component (a1): 100 Parts by Weight in Total
Phenylethylene glycol diacrylate (PhEDA): 100 parts by weight
(1-2) Component (b1): 3 Parts by Weight in Total
Lucirin TPO (product of BASF): 3 parts by weight
(1-3) Component (c1): 0 Part by Weight in Total
The component (c) was not added.
(1-4) Component (d1): 33000 Parts by Weight in Total
Propylene glycol monomethyl ether acetate (product of Tokyo Chemical Industry Co., Ltd., abbreviation PGMEA): 33000 parts by weight (2) Viscosity Measurement of Curable Composition (A1-1)

A cone-plate type rotational viscometer RE-85L (manufactured by TOKI SANGYO CO., LTD.) was used to measure the viscosity at 25° C. of the composition except the solvent component (d1) of the curable composition (A1-1). As a result, the viscosity was 23.0 mPa·s.

(3) Preparation of Cured Film of Curable Composition (A1-1) and Measurement of Dry Etching Rate The composition except the solvent component (d1) of the curable composition (A1-1) was dropped in an amount of 2 μL on a silicon wafer on which an adhesion promoting layer having a thickness of 60 nm had been formed as an adhesion layer. Thereafter, a quartz glass having a thickness of 1 mm was put thereon, and the composition except the solvent component (d1) of the curable composition (A1-1) was filled in a square region with a side length of 25 mm The resultant coating film was then irradiated with light that was emitted from a UV light source equipped with an ultrahigh pressure mercury lamp and was caused to pass through an interference filter for 200 sec. through the quartz glass. VPF-25C-10-15-31300 (manufactured by SIGMA KOKI CO., LTD.) was used as the interference filter. At this time, the wavelength of ultraviolet light that is the irradiation light was set to a single wavelength light of 313±5 nm, and the illuminance was set to 1 mW/cm2.

After the light irradiation, the quartz glass was released to obtain a cured film of the composition except the solvent component (d1) of the curable composition (A1-1) in an average thickness of 3.2 μm on the silicon wafer.

A high density plasma etching apparatus NE-550 manufactured by ULVAC was used to conduct dry etching to the cured film of (A1-1) for 500 sec. by using CF4/CHF3 as an etching gas and setting the flow rate thereof to 50 sccm/50 sccm. The film thickness reduced by the dry etching was measured, thereby calculating the dry etching rate (nm/s). The relative value in the case where the dry etching rate of a curable composition (A2-1) which will be described later is regarded as 100 was 90. Incidentally, a lower value of the dry etching rate means that the dry etching resistance is higher.

(4) Preparation of Curable Composition (A2-1)

The following component (a2), component (b2), component (c2) and component (d2) were compounded, and the resultant was filtered through an ultra-high-molecular-weight polyethylene-made filter of 0.2 μm to prepare a curable composition (A2-1) of Example 1.

(4-1) Component (a2): 94 Parts by Weight in Total
Isobonyl acrylate (product of KYOEISHA CHEMICAL Co., LTD., trade name: IB -XA): 9 parts by weight
Benzyl acrylate (product of OSAKA ORGANIC CHEMICAL INDUSTRY LTD., trade name: V#160): 38 parts by weight
Neopentyl glycol diacrylate (product of KYOEISHA CHEMICAL Co., LTD., trade name: NP-A): 47 parts by weight
(4-2) Component (b2): 3 Parts by Weight in Total
Irgacure 369 (product of BASF): 3 parts by weight
(4-3) Component (c2): 0 Part by Weight in Total
The component (c) was not added.
(4-4) Component (d2): 0 Part by Weight in Total
The component (d) was not added.

(5) Viscosity Measurement of Curable Composition (A2-1)

The viscosity of the curable composition (A2-1) was measured according to the same method as in the curable composition (A1-1). As a result, the viscosity was 3.9 mPa·s.

(6) Preparation of Cured Film of Curable Composition (A2-1) and Measurement of Dry Etching Rate A cured film of the curable composition (A2-1) was prepared according to the same method as in the curable composition (A1-1) to measure the dry etching rate (nm/s). This value was taken to be 100 to evaluate the dry etching rates of compositions of Examples and Comparative Example in the present invention.

(7) Optical Nanoimprint Process

A spin coater is used to apply the curable composition (A1-1) on to a silicon substrate, whereby a film of the curable composition (A1-1) having a thickness of about 5 to 10 nm can be obtained.

One pL of a droplet of the curable composition (A2-1) can be dispersedly arranged on the film of the curable composition (A1-1) by means of an ink jet method. The amount of the droplet is set to, for example, such an amount that the average film thickness of a cured film is about 50 nm. Since the viscosity of the curable composition (A1-1) is low, spread (prespread) of the droplet of the curable composition (A2-1) is fast. Therefore, the optical nanoimprint process can be completed with a high throughput.

A quartz mold on which a fine pattern has been formed is stamped on a layer in which the curable composition (A1-1) and the curable composition (A2-1) are partially mixed, and then the layer is irradiated with light through the quartz mold.

The quartz mold is then separated from a cured film (A3-1) formed of the curable composition (A1-1) and the curable composition (A2-1). The cured film (A3-1) having a pattern form which is an inverted pattern of the fine pattern formed on the quartz mold is obtained in a self-standing state.

A dry etching step is later conducted to the cured film (A3-1). Since the curable composition (A1-1) has a dry etching resistance equal to or more than that of the curable composition (A2-1), dry etching processing can be evenly conducted to a region where the optical nanoimprint process has been carried out even under dry etching conditions optimized for the curable composition (A2-1).

Example 2

(1) Preparation of Curable Composition (A1-2)

The following component (a1), component (b1), component (c1) and component (d1) were compounded, and the resultant was filtered through an ultra-high-molecularweight polyethylene-made filter of 0.2 μm to prepare a curable composition (A1-2) of Example 2.

(1-1) Component (a1): 100 Parts by Weight in Total
2-Phenylpropan-1,3-diyl diacrylate (PhPDA): 100 parts by weight
(1-2) Component (b1): 3 Part by Weight in Total
Lucirin TPO (product of BASF): 3 parts by weight
(1-3) Component (c1): 0 Part by Weight in Total
The component (c) was not added.
(1-4) Component (d1): 33000 Parts by Weight in Total
Propylene glycol monomethyl ether acetate (product of Tokyo Chemical Industry Co., Ltd., abbreviation PGMEA): 33000 parts by weight (2) Viscosity Measurement of Curable Composition (A1-2)

The viscosity at 25° C. of the composition except the solvent component (d1) of the curable composition (A1-2) was measured according to the same method as in the curable composition (A1-1). As a result, the viscosity was 37.7 mPa·s.

(3) Preparation of Cured Film of Curable Composition (A1-2) and Measurement of Dry Etching Rate A cured film of the curable composition (A1-2) was prepared according to the same method as in the curable composition (A1-1) to measure the dry etching rate (nm/s). The relative value in the case where the dry etching rate of the curable composition (A2-1) was taken to be 100 was 89.

(4) to (6) Regarding Curable Composition (A2-2)

The same composition as in Example 1 was used as a curable composition (A2-2).

(7) Optical Nanoimprint Process

An optical nanoimprint process is carried out in the same manner as in Example 1 to obtain a cured film (A3-2) having a pattern form in a self-standing state. Since the viscosity of the curable composition (A1-2) is low, spread (prespread) of a droplet of the curable composition (A2-2) is fast. Therefore, the optical nanoimprint process can be completed with a high throughput.

A dry etching step is later conducted to the cured film (A3-2). Since the curable composition (A1-2) has a dry etching resistance equal to or more than that of the curable composition (A2-2), dry etching processing can be evenly conducted to a region where the optical nanoimprint process has been carried out even under dry etching conditions optimized for the curable composition (A2-2).

Comparative Example 1

(1) to (3) Regarding Curable Composition (A1-0')
In Comparative Example 1, the curable composition (A1) was not used.

(4) to (6) Curable Composition (A2-0')
The same composition as in Example 1 was used as a curable composition (A2-0').

(7) Optical Nanoimprint Process

An optical nanoimprint process is carried out in the same manner as in Example 1 except that the curable composition (A1) is not used to obtain a cured film (A3-0') having a pattern form in a self-standing state. Spread (prespread) of a droplet of the curable composition (A2-0') is relatively slow. Therefore, the throughput of the optical nanoimprint process is low.

A dry etching step is later conducted to the cured film (A3-0'), and dry etching processing can be evenly conducted to a region where the optical nanoimprint process has been carried out.

Conclusion of Examples and Comparative Example

Composition tables of Examples 1 to 2 and Comparative Example 1 and the effects of the invention are shown collectively in Tables 1-2 and Table 3, respectively.

TABLE 1

Composition Table (parts by weight) of curable composition (A1)

| | Component (a1) | Component (b1) | Component (c1) | Component (d1) |
|---|---|---|---|---|
| Example 1 | PhEDA (100) | L. TPO (3) | Not used | PGMEA (33000) |
| Example 2 | PhPDA (100) | | | |

* The curable composition (A1) was not used in Comparative Example 1.

TABLE 2

Composition Table (parts by weight) of curable composition (A2)

| | Component (a2) | Component (b2) | Component (c2) | Component (d2) |
|---|---|---|---|---|
| Example 1 | IB-XA (9) | L. 369 (3) | Not used | Not used |
| Example 2 | V#160 (38) | | | |
| Comp. Ex. 1 | NP-A (47) | | | |

TABLE 3

Effects of the invention

| | Composition (A1) | | Composition (A2) | | | |
|---|---|---|---|---|---|---|
| | Viscosity (mPa·s) | Dry etching rate (relative value) | Viscosity (mPa·s) | Dry etching rate (relative value) | Prespread | Uniform processability |
| Example 1 | 23 | 90 | 3.9 | 100 | Fast | Good |
| Example 2 | 37.7 | 89 | | | Fast | Good |
| Comp. Ex. 1 | (composition (A1) was not used) | | | | Slow | Good |

In Table 3, evaluation of the prespread was made in terms of relative evaluation based on Comparative Example 1. Accordingly, if the speed was faster than that in Comparative Example 1, the prespread was evaluated as "Fast", while if the speed was about equal to or slower than that in Comparative Example 1, the prespread was evaluated as "Slow". The prespread in Examples 1 to 2 is faster than that in Comparative Example 1, that is, the case where the curable composition (A1) was not used.

In Examples 1 to 2, the uniformity of the dry etching processing is good.

The component (a1) used in Examples 1 to 2 is a material high in dry etching resistance, and so the dry etching resistance of the cured films can be made high even in a region in which the concentration of the curable composition (A1) is high, whereby processing of the processing object substrate does not cause troubles, in other words, uniform processing can be realized.

It is shown above that the pattern forming method according to this embodiment is high in throughput and excellent in uniformity of dry etching processing.

According to the present invention, there can be provided a pattern forming method which enables high throughput and excellent uniformity of dry etching processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A pattern forming method comprising, in the following order:
    a step (1) of coating a layer formed of a curable composition (A1) containing at least a polymerizable compound (a1) on a surface of a substrate,
    a step (2) of dispersedly dropping a droplet of a curable composition (A2) containing at least a polymerizable compound (a2) on the layer of the curable composition (A1),
    a step (3) of sandwiching between a mold and the substrate a layer in which the curable composition (A1) and the curable composition (A2) are partially mixed,
    a step (4) of curing a portion of the layer in which the two curable compositions are partially mixed all at once by applying light from the side of the mold, the portion being sandwiched between the mold and the substrate, and
    a step (5) of separating the mold from the layer formed of the cured curable compositions,
    wherein the curable composition (A1) contains at least a compound represented by the following general formula (1) as the polymerizable compound (a1):

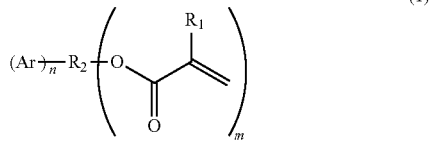

(1)

in the general formula (1), Ar denotes a monovalent aromatic group which may have a substituent, R1 denotes an alkyl group which may have a substituent or a hydrogen atom, R2 denotes an (m+n)-valent alkyl group which may have a substituent, m is an integer of 2 or more, and n is an integer of 1 or more.

2. The pattern forming method according to claim 1, wherein the step (2) is the step of dispersedly dropping the droplet of the curable composition (A2) on a liquid film of the curable composition (A1).

3. The pattern forming method according to claim 1, wherein the curable composition (A1) contains at least a compound represented by the following general formula (2) as the polymerizable compound (a1):

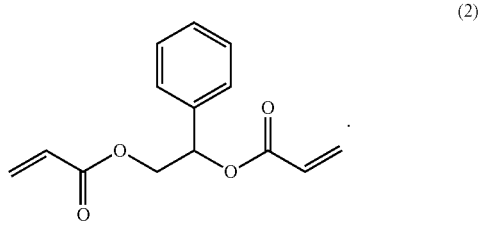

(2)

4. The pattern forming method according to claim 1, wherein the curable composition (A1) contains at least a compound represented by the following general formula (3) as the polymerizable compound (a1):

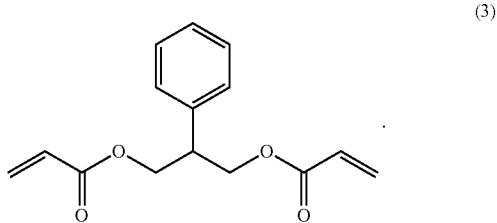

(3)

5. The pattern forming method according to claim 1, wherein the surface tension of the curable composition (A1) except solvents is higher than the surface tension of the curable composition (A2) except solvents.

6. The pattern forming method according to claim 1, wherein the viscosity of the curable composition (A1) except the solvents is 1 mPa·s or more to 1000 mPa·s or less, and the viscosity of the curable composition (A2) except the solvents is 1 mPa·s or more to 12 mPa·s or less.

7. The pattern forming method according to claim 1, wherein a material of the surface of the mold is quartz.

8. The pattern forming method according to claim 1, wherein the step (3) of sandwiching is conducted under an atmosphere containing a condensable gas.

9. A production method for a processed substrate comprising the pattern forming method according to claim 1.

10. A production method for a semiconductor element comprising a pattern forming method, the pattern forming method comprising, in the following order:
    a step (1) of coating a layer formed of a curable composition (A1) containing at least a polymerizable compound (a1) on a surface of a substrate,
    a step (2) of dispersedly dropping a droplet of a curable composition (A2) containing at least a polymerizable compound (a2) on the layer of the curable composition (A1) to form lamination,
    a step (3) of sandwiching between a mold and the substrate a layer in which the curable composition (A1) and the curable composition (A2) are partially mixed,
    a step (4) of curing a portion of the layer in which the two curable compositions are partially mixed all at once by applying light from the side of the mold, the portion being sandwiched between the mold and the substrate, and
    a step (5) of separating the mold from the layer formed of the cured curable compositions,
    wherein the curable composition (A1) contains at least a compound represented by the following general formula (1) as the polymerizable compound (a1):

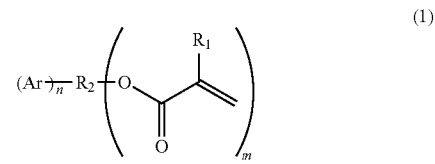

(1)

in the general formula (1), Ar denotes a monovalent aromatic group which may have a substituent, R1 denotes an alkyl group which may have a substituent or a hydrogen atom, R2 denotes an (m+n)-valent alkyl group which may have a substituent, m is an integer of 2 or more, and n is an integer of 1 or more.

11. A production method for an optical component comprising the pattern forming method according to claim 1.

12. A production method for an imprint mold comprising the pattern forming method according to claim 1.

13. A pretreatment method for conducting an imprint with arranging a curable composition on a substrate, comprising coating onto the substrate an imprint pretreatment coating material, Wherein the imprint pretreatment coating material contains at least a compound represented by the following general formula (1) as a polymerizable compound (a1):

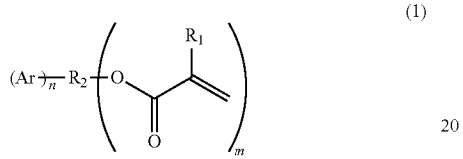

(1)

in the general formula (1), Ar denotes a monovalent aromatic group which may have a substituent, $R_1$ denotes an alkyl group which may have a substituent or a hydrogen atom, $R_2$ denotes an (m+n)-valent alkyl group which may have a substituent, m is an integer of 2 or more, and n is an integer of 1 or more.

14. A pattern forming method forming a pattern on a substrate including a step of dropping a resist dispersedly on the substrate coated with an imprint pretreatment coating material, Wherein the imprint pretreatment coating material contains at least a compound represented by the following general formula (1) as a polymerizable compound (a1):

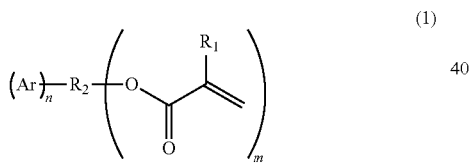

(1)

in the general formula (1), Ar denotes a monovalent aromatic group which may have a substituent, $R_1$ denotes an alkyl group which may have a substituent or a hydrogen atom, $R_2$ denotes an (m+n)-valent alkyl group which may have a substituent, m is an integer of 2 or more, and n is an integer of 1 or more.

15. A pattern forming method, comprising:
dispensing a droplet of an imprint resist discretely to a liquid film formed of a liquid pretreatment coating on a substrate such that the droplet is spread on the liquid film to yield a spread imprint resist, wherein the liquid pretreatment coating comprises a polymerizable component and the imprint resist is a polymerizable composition;
after the dispensing of the droplet of the imprint resist, contacting the spread imprint resist with a mold; and
polymerizing the spread imprint resist and the pretreatment coating by applying light to yield a polymeric layer on the substrate, wherein the liquid pretreatment coating contains at least a compound represented by the following general formula (1) as the polymerizable compound (a1):

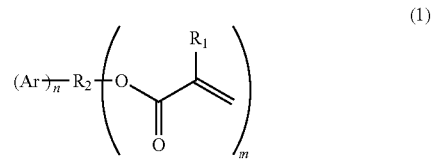

(1)

in the general formula (1), Ar denotes a monovalent aromatic group which may have a substituent, $R_1$ denotes an alkyl group which may have a substituent or a hydrogen atom, $R_2$ denotes an (m+n)-valent alkyl group which may have a substituent, m is an integer of 2 or more, and n is an integer of 1 or more.

16. A method for manufacturing a semiconductor device, the method comprising:
providing a liquid pretreatment coating on a substrate, wherein the liquid pretreatment coating comprises a polymerizable component, and the liquid pretreatment coating contains at least a compound represented by the following general formula (1) as the polymerizable compound (a1):

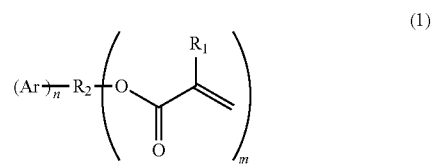

(1)

in the general formula (1), Ar denotes a monovalent aromatic group which may have a substituent, $R_1$ denotes an alkyl group which may have a substituent or a hydrogen atom, $R_2$ denotes an (m+n)-valent alkyl group which may have a substituent, m is an integer of 2 or more, and n is an integer of 1 or more;
dispensing a droplet of an imprint resist to a liquid film formed of the liquid pretreatment coating such that the droplet is spread on the liquid film to yield a spread imprint resist, wherein the imprint resist is a polymerizable composition;
after the dispensing of the droplet of the imprint resist, contacting the spread imprint resist with a mold;
polymerizing the spread imprint resist and the pretreatment coating by applying light to yield a polymeric layer on the substrate;
separating the mold from the polymeric layer; and
dry etching the substrate via the polymeric layer.

17. The method according to claim 16, wherein:
providing the liquid pretreatment coating comprises coating the substrate using a dip coating method, an air knife coating method, a curtain coating method, a wire bar coating method, a gravure coating method, an extrusion coating method, a spin coating method, or a slit scan method; and
dispensing the droplet of the imprint resist onto the liquid pretreatment coating using an ink jet method.

* * * * *